US012777859B2

(12) United States Patent
Chen et al.

(10) Patent No.: US 12,777,859 B2
(45) Date of Patent: Oct. 27, 2026

(54) SEMICONDUCTOR STRUCTURE AND METHOD FOR FORMING THE SAME

(71) Applicant: HUA HONG SEMICONDUCTOR (WUXI) LIMITED, Wuxi (CN)

(72) Inventors: Tongqing Chen, Wuxi (CN); Yang Yuan, Wuxi (CN); Zuohua Zhu, Wuxi (CN)

(73) Assignee: Hua Hong Semiconductor (Wuxi) Limited, Wuxi (CN)

( * ) Notice: Subject to any disclaimer, the term of this patent is extended or adjusted under 35 U.S.C. 154(b) by 482 days.

(21) Appl. No.: 18/135,558

(22) Filed: Apr. 17, 2023

(65) Prior Publication Data

US 2023/0420262 A1 Dec. 28, 2023

(30) Foreign Application Priority Data

Jun. 23, 2022 (CN) ........................ 202210720294.X

(51) Int. Cl.
*H10P 50/28* (2026.01)
*H10P 50/00* (2026.01)
*H10P 95/00* (2026.01)

(52) U.S. Cl.
CPC ............ *H10P 50/283* (2026.01); *H10P 50/73* (2026.01); *H10P 95/06* (2026.01)

(58) Field of Classification Search
CPC ...................... H01L 21/76232; H01L 23/3171
See application file for complete search history.

(56) References Cited

U.S. PATENT DOCUMENTS 8,796,666 B1 * 8/2014 Huang ................. H10D 30/751 438/285
2006/0276001 A1 * 12/2006 Ogawa .............. H10W 10/0147 257/E29.267
2006/0292793 A1 * 12/2006 Sandhu ............. H10W 10/0143 438/257

(Continued)

FOREIGN PATENT DOCUMENTS

CN 106298630 A 1/2017
JP 2001085509 A 3/2001

(Continued)

OTHER PUBLICATIONS

Concentration Definition (Chemistry) via https://www.thoughtco.com/definition-of-concentration-605844 (Year: 2024).*

(Continued)

*Primary Examiner* — Binh X Tran
(74) *Attorney, Agent, or Firm* — Boyle Fredrickson S.C.

(57) ABSTRACT

The present disclosure provides a semiconductor structure and a method for forming the semiconductor structure. The method includes: providing a substrate; forming a mask layer on the substrate, wherein the mask layer exposes a part of a surface of the substrate; etching the substrate by a plasma etching process using the mask layer as a mask to form a plurality of trenches and an active region between the plurality of trenches; and forming an insulating layer in the plurality of trenches. The method according to some embodiments of the present disclosure can protect a corner region of the active region and improve a size stability of the active region.

14 Claims, 7 Drawing Sheets

(56) References Cited

U.S. PATENT DOCUMENTS

| | | | | |
|---|---|---|---|---|
| 2008/0286978 | A1* | 11/2008 | Chen | H10P 50/244<br>438/713 |
| 2019/0165137 | A1* | 5/2019 | Chen | H10D 30/024 |
| 2022/0223381 | A1* | 7/2022 | Liu | H01J 37/321 |

FOREIGN PATENT DOCUMENTS

| | | | | |
|---|---|---|---|---|
| KR | 100325605 | B1 | 2/2002 | |
| KR | 100325606 | B1 * | 2/2002 | H10W 10/13 |

OTHER PUBLICATIONS

Chinese Office Action for Application No. 202210720294 issued Jun. 24, 2025 (14 pages).

* cited by examiner

SEMICONDUCTOR STRUCTURE AND METHOD FOR FORMING THE SAME

CROSS-REFERENCE TO RELATED APPLICATIONS

This application claims the benefit of priority to Chinese patent application No. 202210720294.X, filed on Jun. 23, 2022, the entire disclosures of which are incorporated herein by reference.

TECHNICAL FIELD

The present disclosure relates to the technical field of semiconductors, and more particularly to a semiconductor structure and a method for forming the semiconductor structure.

BACKGROUND OF THE INVENTION

With a development of integrated circuits, traditional local oxidation of silicon (LOCOS) technology has been unable to meet a demand of continuous reduction of feature size and has become a constraint factor affecting device performance. Shallow trench isolation technology replaces local oxidation of silicon technology and is used in integrated circuit isolation process. The shallow trench isolation technology can eliminate bird beak defect of the local oxidation of silicon technology under completely flat conditions, and an insulation layer can be thicker, which can reduce a leakage current between electrodes and withstand a greater breakdown voltage.

In the shallow trench isolation technology, a dry etching process is performed to etch a shallow trench in an isolation area, and a high-density plasma (HDP) process is performed to fill the trench with oxides, and then a mechanochemical grinding process is performed to remove excess oxide layer to form a trench oxide isolation on a silicon wafer.

However, the existing shallow trench isolation technology needs to be further improved.

SUMMARY OF THE INVENTION

The present disclosure provides a semiconductor structure and a method for forming the semiconductor structure, in order to improve the performance of the semiconductor structure.

According to an aspect of the present disclosure, a semiconductor structure includes: a substrate including a plurality of trenches and an active region between the plurality of trenches, and a corner region is formed between a top and a side wall of the active region; a first protective layer disposed on a surface of the corner region exposed by the plurality of trenches; and an insulating layer disposed in the plurality of trenches.

According to some embodiments, the first protective layer is made by a material including silicon oxide.

According to another aspect of the present disclosure, a semiconductor structure includes: providing a substrate; forming a mask layer on the substrate, wherein the mask layer exposes a part of a surface of the substrate; etching the substrate by a plasma etching process using the mask layer as a mask to form a plurality of trenches and an active region between the plurality of trenches; and forming an insulating layer in the plurality of trenches; wherein the plasma etching process includes: performing a first etching process, wherein a plurality of initial trenches are formed in the substrate, an initial active region is formed between the plurality of initial trenches, and a corner region is formed between a top and a side wall of the active region; performing a second etching process after the first etching process, wherein a reaction gas is introduced into an etching cavity to form a first protective layer on a surface of the corner region exposed by the plurality of initial trenches; and performing a third etching process after the second etching process, wherein the substrate at a bottom of the plurality of initial trenches is etched to form the active region and the plurality of trenches.

According to some embodiments, the first protective layer is made by a material including silicon oxide.

According to some embodiments, in the second etching process, the reaction gas includes oxygen having a concentration greater than or equal to 100 sccm, and a radio frequency power is greater than or equal to 900 W.

According to some embodiments, in the second etching process, the concentration of oxygen is in a range of 100 sccm to 240 sccm, and the radio frequency power is in a range of 900 W to 1300 W.

According to some embodiments, the method further includes: forming a second protective layer on a side wall and a bottom surface of the plurality of trenches after forming the plurality of trenches and before forming the insulating layer.

According to some embodiments, forming the second protective layer includes an in situ steam generation process.

According to some embodiments, a thickness of the second protective layer is in a range of 50 Å to 150 Å.

According to some embodiments, the insulating layer is also disposed between adjacent mask layers.

According to some embodiments, forming the insulating layer includes: forming an insulating material layer in the plurality of trenches and on a surface of the mask layer; and planarizing the insulating material layer until the surface of the mask layer is exposed.

According to some embodiments, forming the insulating material layer includes a high-density plasma deposition process.

According to some embodiments, the method further includes: removing the mask layer and exposing a top surface of the active region after forming the insulating layer; and forming a gate oxide layer on a surface of the active region and forming a gate electrode on a surface of the gate oxide layer.

According to some embodiments, the mask layer includes a first mask layer and a second mask layer disposed on the first mask layer.

According to some embodiments, the first mask layer is made by a material including silicon oxide, and the second mask layer is made by a material including silicon nitride.

According to some embodiments, in the first etching process, an etching gas includes one or more of HBr, CH2F2 or CF4, a gas flow is in a range of 15 sccm to 100 sccm, and an etching power is in a range of 350 W to 1500 W.

According to some embodiments, in the third etching process, an etching gas includes one or more of HBr, SF6, CH2F2 or CH3F, and a gas flow ranges is in a range of 20 sccm to 400 sccm.

According to some embodiments, a depth of the plurality of initial trenches is in a range of 1100 Å to 1500 Å.

The embodiments of the present disclosure have following beneficial effects:

According to some embodiments of the present disclosure, in the process of etching the substrate, a plasma etching process is performed to form the trenches in the substrate, the first etching process is performed to form the initial trenches, and the corner region is formed between the top and the side wall of the initial active region. Then, in the second etching process, the reactive gas is introduced into the etching cavity to form the first protective layer on the surfaces of the corner region exposed by the initial trenches and the mask layer, which can protect the corner region, reduce further etching of the corner region in the subsequent etching process of forming the trenches, and improve the size stability of the active region. Further, the first protective layer is formed at an initial stage of etching for forming the trenches. Compared with the conventional process of forming the protective layer by consuming the active region after forming the trenches, the impact on a top size of the active region is small, which is conducive to improving the stability of the device performance.

Further, the method includes forming a second protective layer on the side wall and the bottom surface of the plurality of trenches after forming the plurality of trenches and before forming the insulating layer, and the method for forming the second protective layer includes an in situ steam generation process. Since the corner region of the active region can be protected by the first protective layer, where the corner region is an area most easily affected by plasma etching during forming the insulating layer, the thickness of the second protective layer does not need to be too large, thereby reducing the formation of silicon oxide due to the consumption of silicon nitride in the mask layer on the top of the corner region during forming the second protective layer, and thus preventing affecting the thickness uniformity of the gate oxide layer on the top of the active region due to too thicker silicon oxide on the corner region.

DETAILED DESCRIPTION OF THE EMBODIMENTS

It should be noted that "surface" and "upper" in this specification are used to describe a relative position relationship of space and are not limited to direct contact.

As described in the background, the existing shallow trench isolation technology needs to be further improved. Now, a method for forming a semiconductor structure is described and analyzed.

FIGS. 1 to 4 are structural schematic view illustrating steps of a method for forming an existing semiconductor structure.

Figure 1:
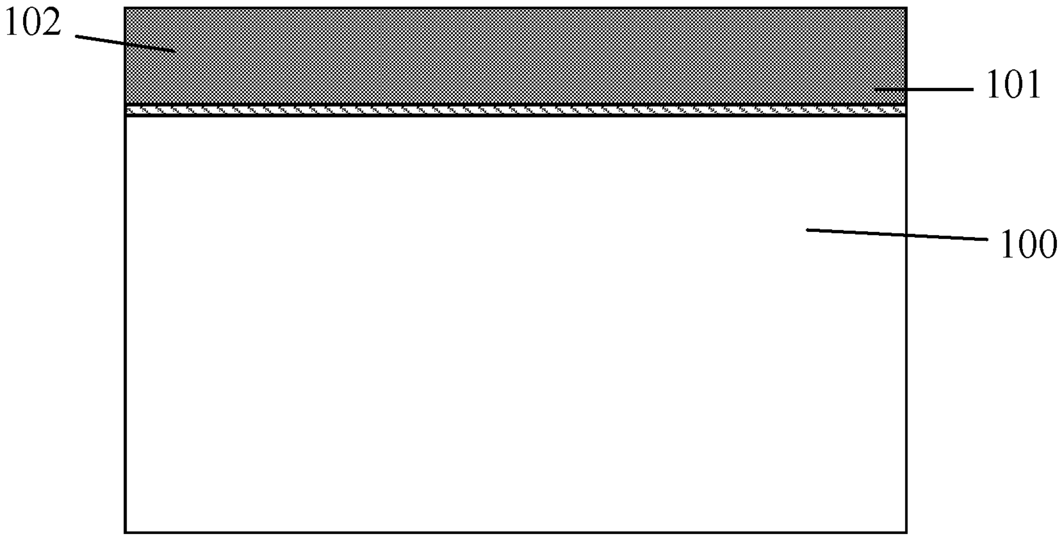
(PRIOR ART) FIG. 1
FIGS. 1 to 4 are structural schematic view illustrating steps of a method for forming an existing semiconductor structure.

Referring to FIG. 1, a substrate 100 is provided. A mask material layer is formed on the substrate 100. The mask material layer includes a silicon oxide material layer 101 and a silicon nitride material layer 102 disposed on a surface of the silicon oxide material layer 101.

Figure 2:
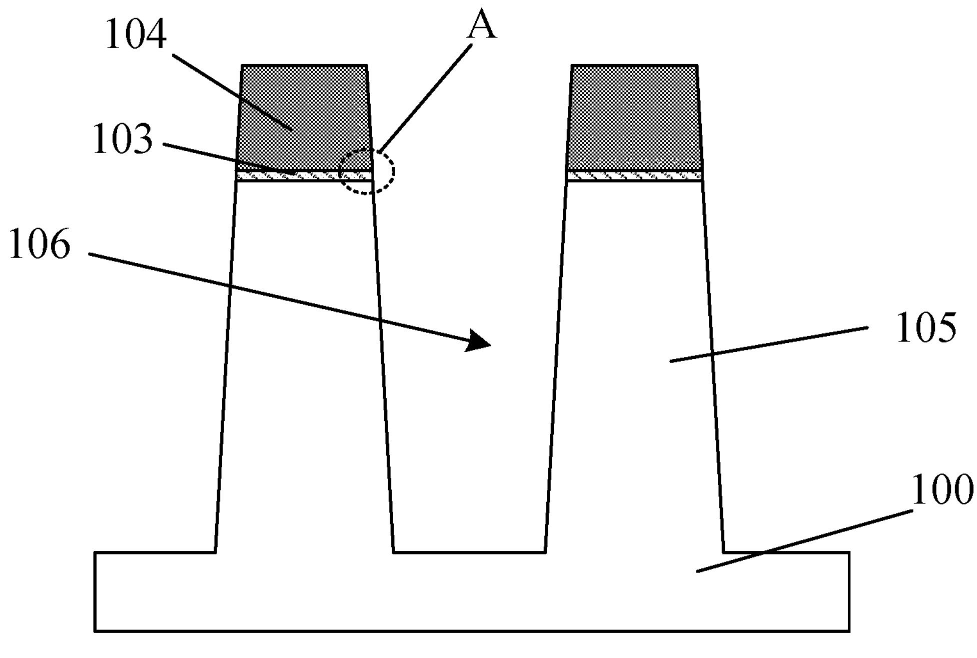
(PRIOR ART) FIG. 2

Referring to FIG. 2, the mask material layer is patterned to form a mask layer. The mask layer includes a silicon oxide layer 103 and a silicon nitride layer 104. The substrate 100 is etched using the mask layer as a mask, so that an active region 105 is formed in the substrate 100, and a trench 106 is formed between adjacent active regions 105.

Figure 3:
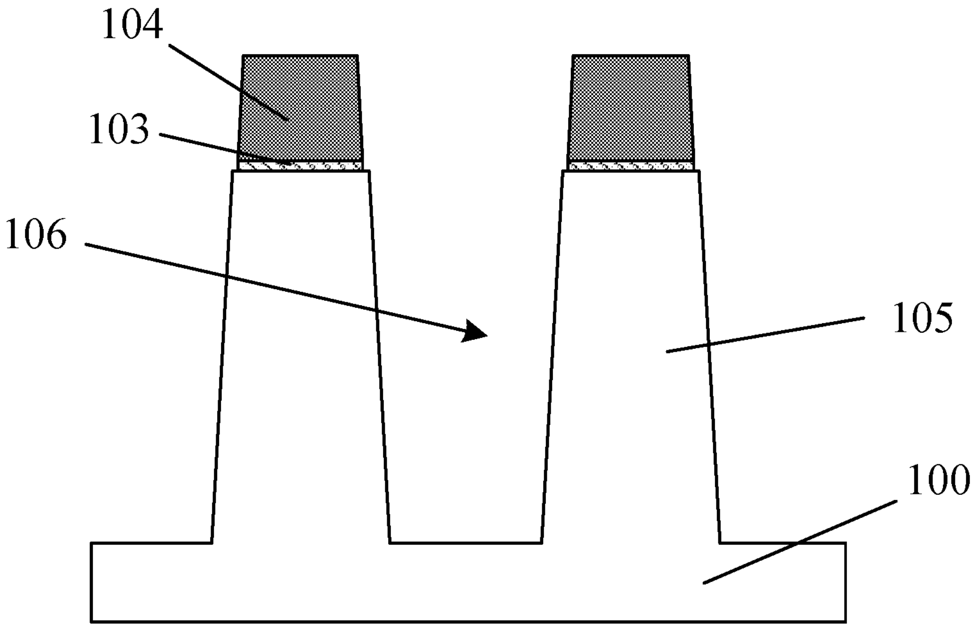
(PRIOR ART) FIG. 3

Referring to FIG. 3, the mask layer is back etched to expose a part of a top surface of the active region 105.

Figure 4:
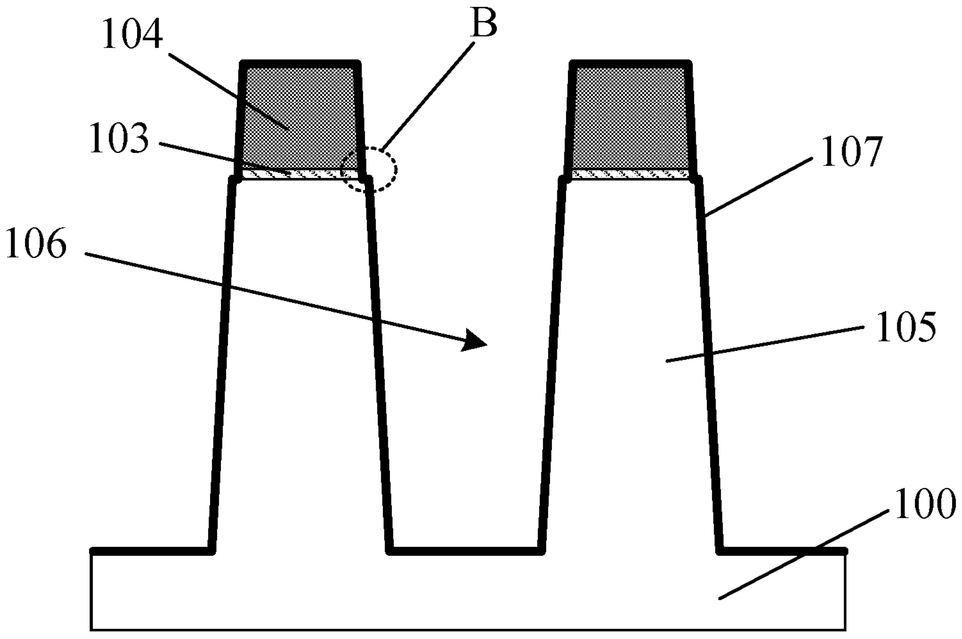
(PRIOR ART) FIG. 4

Referring to FIG. 4, an oxidation treatment is performed on a side wall and a bottom surface of the trench 106 to form a protective layer 107 on the side wall and the bottom surface of the trench 106.

In the above method, subsequently, a high-density plasma (HDP) deposition process is used to fill the trench 106 with a silicon oxide material to form a shallow trench isolation between the active regions 105. The protective layer 107 is used to reduce an etching damage to the silicon substrate caused by a high density plasma during the deposition process, especially to protect a top corner of the active region 105 (as shown in area A in FIG. 2) from the etching damage caused by a long-term plasma bombardment.

However, the method for forming the protective layer 107 includes an In Situ Steam Generation (ISSG) process. During an oxidation process under process conditions, a large amount of silicon and silicon nitride in the mask layer will be consumed. A large consumption of silicon will cause a width of the active region 105 (referring to a size in a direction parallel to a surface of the substrate) to shrink, which can affect the device performance; and the consumption of silicon nitride will cause a thickness of a silicon oxide material layer on the top corner of the active region 105 (as shown in area B in FIG. 2) to become thicker. Due to an uneven thickness of the silicon oxide material on the top of the active region 105, the silicon oxide material at the top corner of the subsequent active region 105 is difficult to be removed, thus increasing a thickness of a gate oxide layer formed at the top corner of the active region 105, which is not conducive to a control ability of a gate electrode near the top corner of the active region 105, thus affecting the device performance.

In order to solve the above problems, the present disclosure provides a semiconductor structure and a method for forming the semiconductor structure. In the process of etching a substrate using a plasma etching process to forming a plurality of trenches in the substrate, a first etching process is performed to form a plurality of initial trenches, and a corner region is formed between a top and a side wall of an initial active region. Then, in a second etching process, an reactive gas is introduced into an etching cavity to form a first protective layer on a surface of the corner region exposed by the initial trenches and the mask layer, which can protect the corner region, reduce further etching of the corner region in the subsequent etching process of forming the trenches, and improve the size stability of the active region. Further, the first protective layer is formed at an initial stage of etching for forming the trenches. Compared with the conventional process of forming the protective layer by consuming the active region after forming the trenches, the impact on a top size of the active region is small, which is conducive to improving the stability of the device performance.

In order to make above purposes, features and beneficial effects of the present disclosure more obvious and understandable, specific embodiments of the present disclosure will be described in detail with the attached drawings.

FIGS. 5 to 12 are structural schematic view illustrating steps of a method for forming a semiconductor structure according to an embodiment of the present disclosure.

Figure 5:
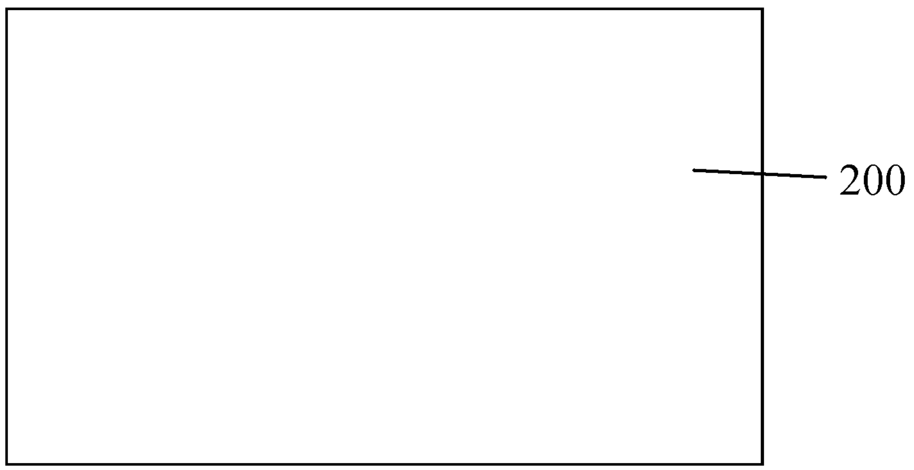
FIGS. 5 to 12 are structural schematic view illustrating steps of a method for forming a semiconductor structure according to an embodiment of the present disclosure.

Referring to FIG. 5, a substrate 200 is provided.

In some embodiments, the material of the substrate 200 is monocrystalline silicon. In other embodiments, the material of the substrate may be polycrystalline silicon or amorphous silicon, or semiconductor materials such as germanium, silicon germanium, gallium arsenide, or semiconductor structures on insulators.

Figure 6:
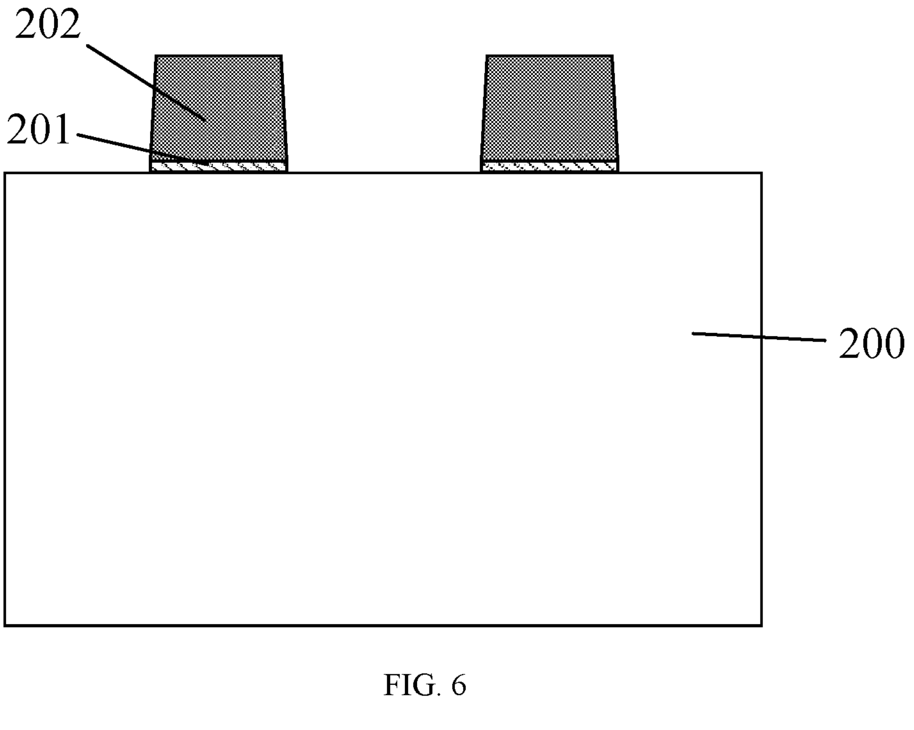

Referring to FIG. 6, a mask layer is formed on the substrate 200, and the mask layer exposes a part of a surface of the substrate 200.

The mask layer includes a first mask layer 201 and a second mask layer 202 disposed on the first mask layer 201.

The material of the first mask layer 201 includes silicon oxide, and the material of the second mask layer 202 includes silicon nitride. In some embodiments, the material of the first mask layer 201 is silicon oxide, and the material of the second mask layer 202 is silicon nitride.

The method for forming the mask layer includes: forming a first mask material layer (not shown in the figure) on the substrate 200 and forming a second mask material layer (not shown in the figure) on the first mask material layer; forming a patterned photoresist layer (not shown in the figure) on the second mask material layer; and etching the first mask material layer and the second mask material layer using the photoresist layer as a mask until the surface of the substrate 200 is exposed, so that the first mask layer 201 is formed by the first mask material layer and the second mask layer 202 is formed by the second mask material layer.

Figure 13:
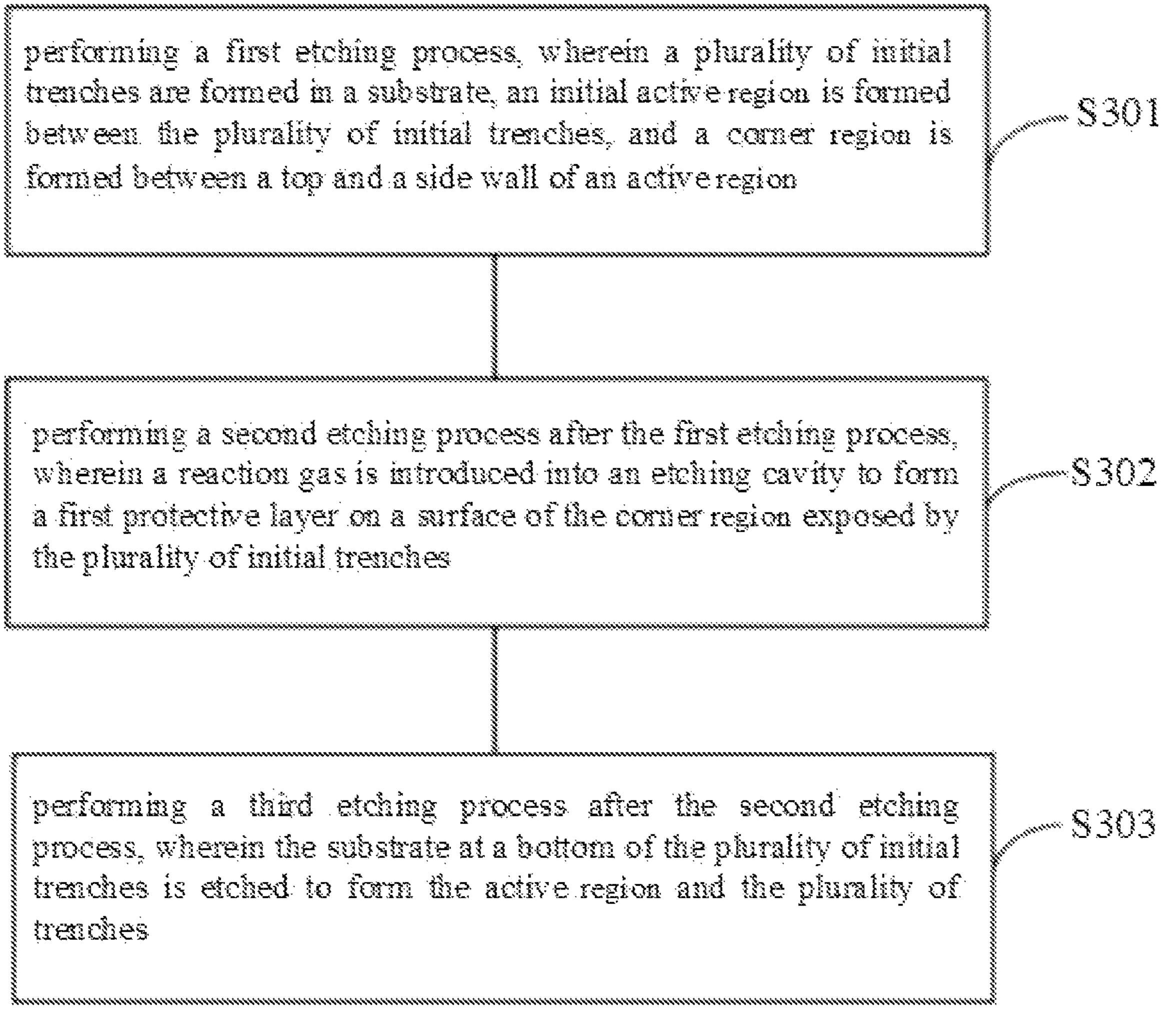
FIG. 13 is a flow chart of steps of a plasma etching process in a method for forming a semiconductor structure according to an embodiment of the present disclosure.

Subsequently, the substrate 200 is etched by a plasma etching process using the mask layer as a mask to form the plurality of trenches and the active region between the plurality of trenches in the substrate 200. FIG. 13 illustrates steps of the plasma etching process.

FIG. 13 is a flow chart of steps of a plasma etching process in a method for forming a semiconductor structure according to an embodiment of the present disclosure.

Referring to FIG. 13, the plasma etching process includes following steps:

In S301, a first etching process is performed. A plurality of initial trenches and an initial active region between the plurality of initial trenches are formed in the substrate, and a corner region is formed between a top and a side wall of the active region.

In S302, a second etching process is performed after the first etching process. A reaction gas is introduced into an etching cavity to form a first protective layer on a surface of the corner region exposed by the plurality of initial trenches.

In S303, a third etching process is performed after the second etching process. The substrate at a bottom of the plurality of initial trenches is etched to form the active region and the plurality of trenches.

Next, each step is analyzed and explained.

Figure 7:
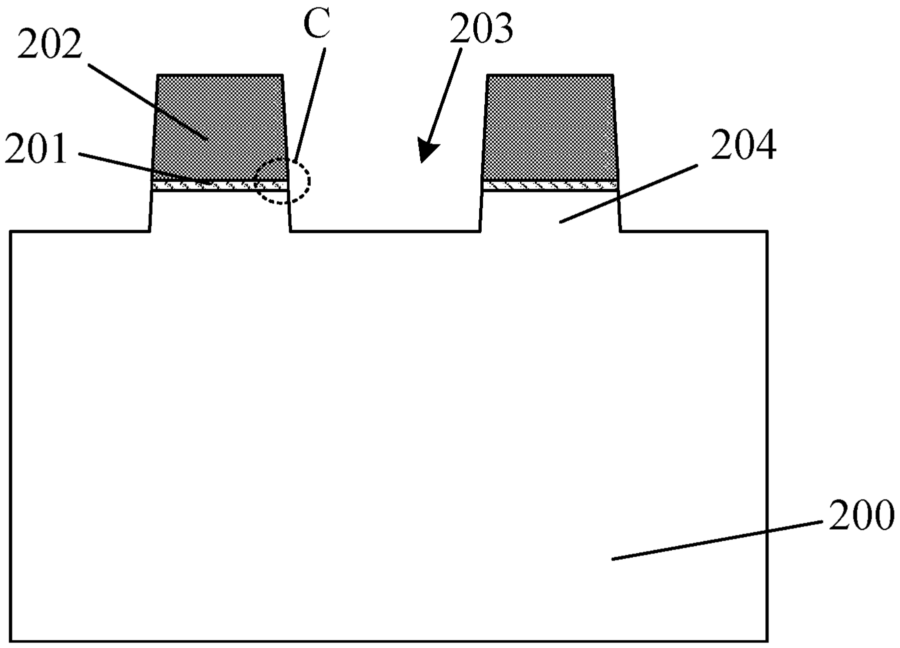

Referring to FIG. 7 and still referring to FIG. 13, the first etching process is performed to form an initial trench 203 in the substrate 200 and an initial active region 204 between adjacent initial trenches 203. A corner region C is formed between a top and a side wall of the initial active region 204.

The initial active region 204 is used to form the active region.

A depth of the initial trench 203 is in a range of 1100 Å to 1500 Å.

In the first etching process, an etching gas includes one or more of HBr, $CH_2F_2$ or $CF_4$, a gas flow is in a range of 15 sccm to 100 sccm, and an etching power is in a range of 350 W to 1500 W.

Figure 8:
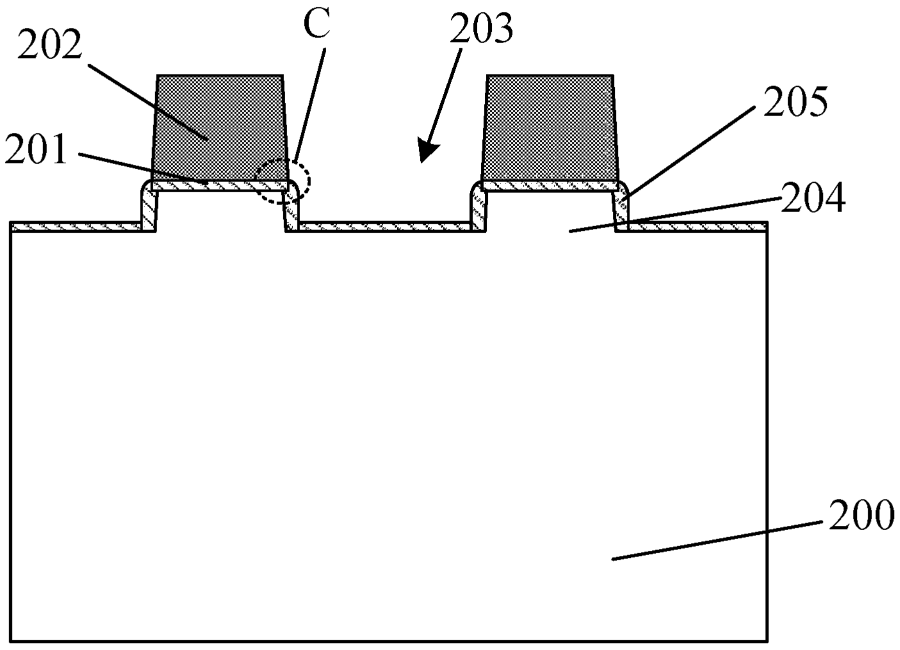

Referring to FIG. 8 and still referring to FIG. 13, the second etching process is performed after the first etching process. The reaction gas is injected into the etching cavity, and a first protective layer 205 is formed on a surface of the corner region C exposed by the initial trench 203.

The first protective layer 205 is formed at an initial stage of etching for forming the trench. Compared with forming the protective layer by consuming the active region after forming the trench, the impact on a top size of the active region is small, which is conducive to improving the device performance.

The material of the first protective layer 205 includes silicon oxide. In some embodiments, the material of the first protective layer 205 is silicon oxide.

In the second etching process, the reaction gas includes oxygen having a concentration greater than or equal to 100 sccm, and a radio frequency power is greater than or equal to 900 W.

In some embodiments, the concentration of oxygen is in a range of 100 sccm to 240 sccm, and the radio frequency power is in a range of 900 W to 1300 W.

In some embodiments, the first protective layer 205 is also formed at an exposed bottom of the initial trench 203.

Figure 9:
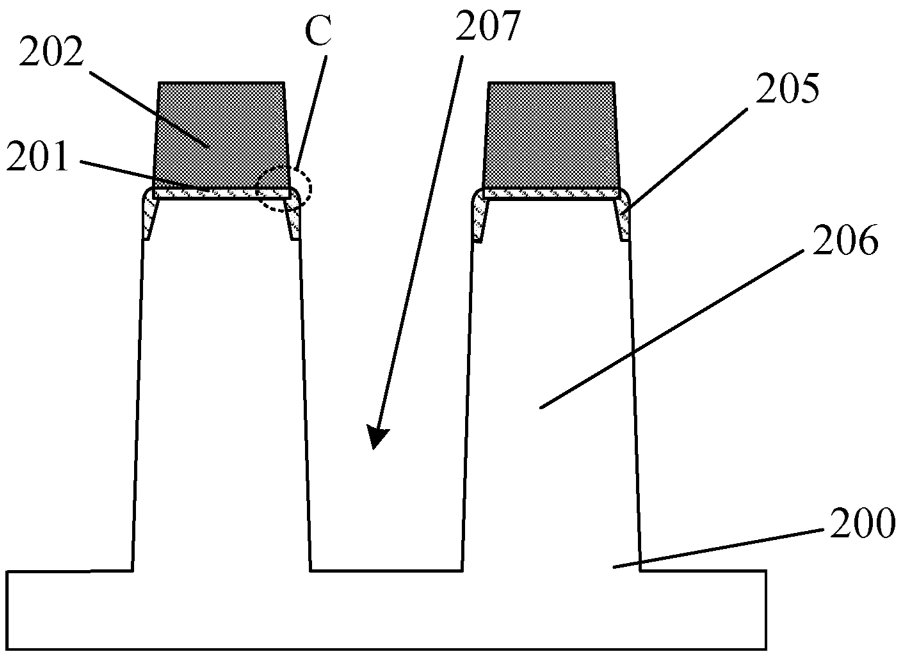

Referring to FIG. 9 and still referring to FIG. 13, the third etching process is performed after the second etching process, and the substrate 200 is still etched at a bottom of the initial trench 203 to form an active region 206 and a trench 207.

In some embodiments, in the third etching process, an etching gas includes one or more of HBr, SF6, CH2F2 or CH3F, and a gas flow ranges is in a range of 20 sccm to 400 sccm.

Specifically, in some embodiments, in the third etching process, the first protective layer 205 at the bottom of the initial trench 203 is etched, and the first protective layer 205 on the side wall of the initial trench 203 can protect the corner region C in the subsequent etching process, reduce further etching of the corner region C in the subsequent etching process of forming the trench, and improve the size stability of the active region.

Figure 10:
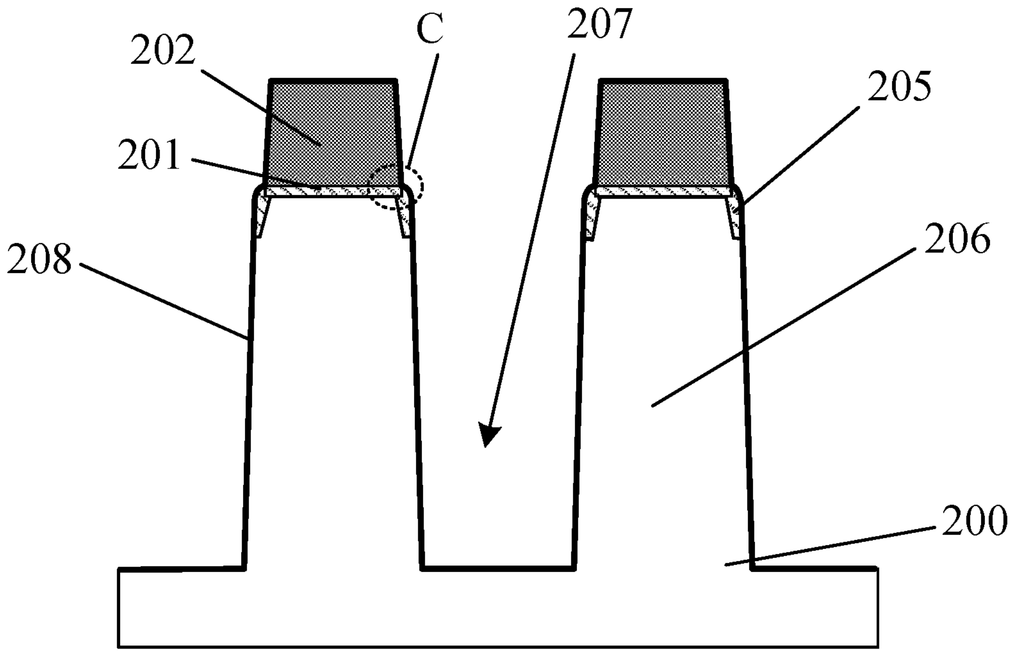

FIG. 10 illustrates the semiconductor structure after forming the trench 207 and before forming the insulating layer.

Referring to FIG. 10, a second protective layer 208 is formed on a side wall and a bottom surface of the trench 207.

The second protective layer 208 is used to reduce the etching damage of plasma on the side wall and the bottom of the trench 207 in the high-density plasma deposition process for forming the insulating layer.

Since the corner region C of the active region can be protected by the first protective layer, where the corner region C is an area most easily affected by plasma etching during forming the insulating layer, the thickness of the second protective layer 208 does not need to be too high, thus reducing the formation of silicon oxide due to the consumption of silicon nitride in the mask layer on the top of the corner region C during forming the second protective layer 208, and thus preventing affecting the thickness uniformity of a gate oxide layer on the top of the active region and the control ability of a gate electrode to an edge region of the active region due to too thicker silicon oxide on the corner region C.

The method for forming the second protective layer 208 includes an in steam generation process.

A thickness of the second protective layer 208 is in a range of 50 Å to 150 Å.

Figure 11:
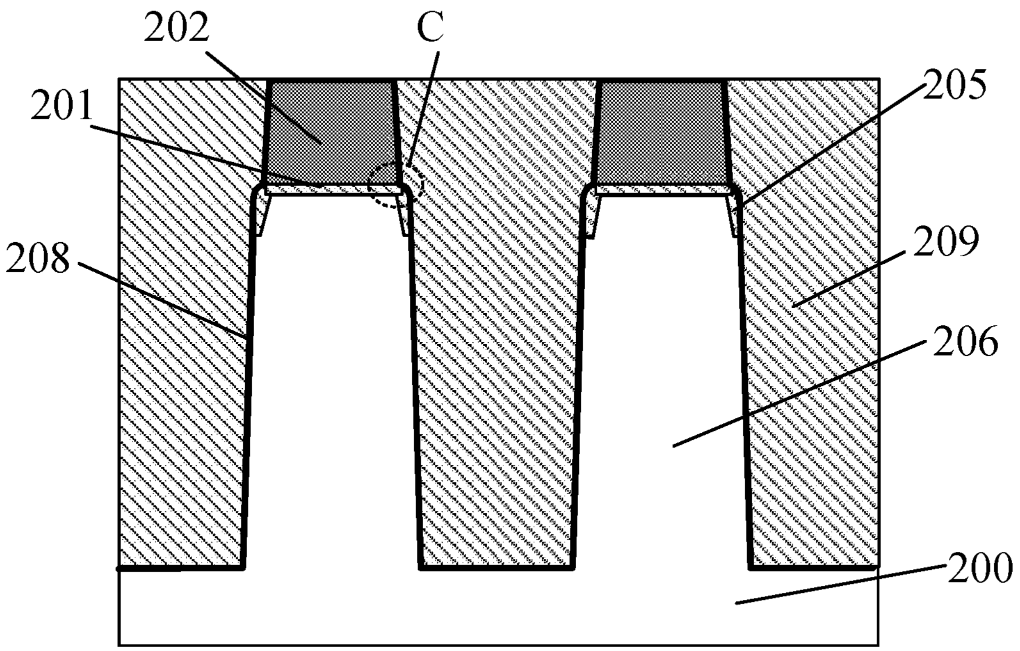

Subsequently, an insulating layer is formed in the trench 207. In some embodiments, the insulating layer is also disposed between adjacent mask layers. FIG. 11 illustrates the method for forming the insulation layer.

Referring to FIG. 11, the insulating material layer (not shown in the figure) is formed in the trench 207 and on the surface of the mask layer, and the insulating material layer is planarized until the surface of the mask layer is exposed.

In some embodiments, the method for forming the insulating material layer includes a high-density plasma deposition process. The high-density plasma deposition process has good filling performance and can improve the quality of the formed insulating material layer.

The planarizing process includes a mechanochemical grinding process. In some embodiments, because the mechanochemical grinding process cannot meet the requirements for the flatness of a device surface, the surface of the mask layer may be used as a stop layer of the planarizing process.

In some embodiments, the insulating layer 209 is also disposed between adjacent mask layers 202.

Figure 12:
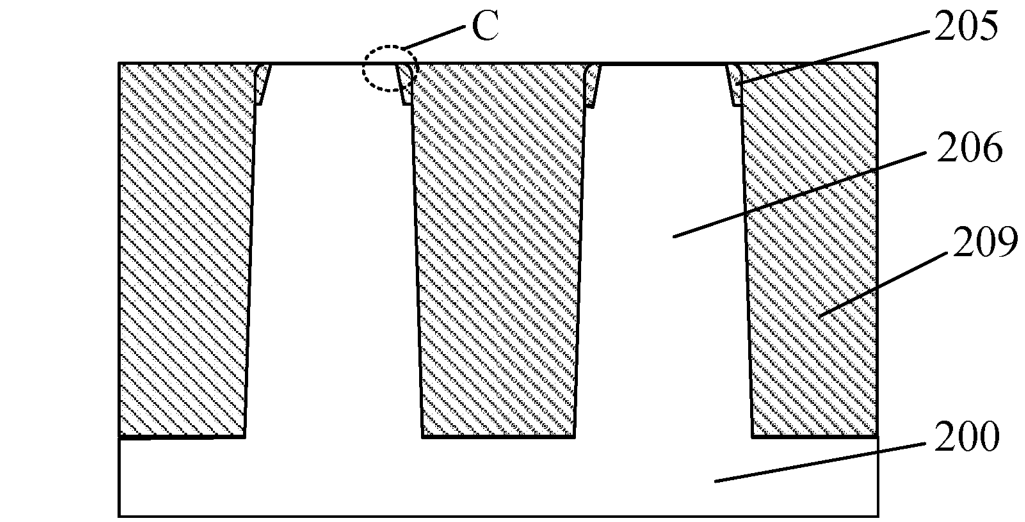

Referring to FIG. 12, after forming the insulating layer 209, the mask layer is removed to expose a top surface of the active region 206.

The process for removing the mask layer includes one or both of a dry etching process and a wet etching process.

In some embodiments, the process for removing the mask layer is a wet etching process. Specifically, the material of the second mask layer 202 is silicon nitride, which can be removed with phosphoric acid solution, and the material of the first mask layer 201 is silicon oxide, which can be removed by hydrofluoric acid solution.

Because the thickness of the silicon oxide material on the top of the active region 206 is relatively uniform, after removing the mask layer, the residue of the silicon oxide material on the top of the active region 206 can be reduced, thereby improving the uniformity of the gate oxide layer on the surface of the active region 206 subsequently formed, and improving the control ability of the gate to the edge region of the active region.

Subsequently, a gate oxide layer (not shown in the figure) is formed on a surface of the active region 206, and a gate electrode (not shown in the figure) is formed on a surface of the gate oxide layer.

Specifically, in some embodiments, before the gate oxide layer is formed, the insulating layer 209 is also etched so that a top surface of the insulating layer 209 is flush with the top surface of the active region 206.

Accordingly, another embodiment of the present disclosure also provides a semiconductor structure formed by the above method. Still referring to FIG. 12. The semiconductor structure includes a substrate 200. The substrate 200 includes a plurality of trenches 207 (as shown in FIG. 9) and an active region 206 disposed between the plurality of trenches 207, and a corner region C is formed between a top and a side wall of the active region 206. The semiconductor structure also includes a first protective layer 205 disposed on a surface of the corner region C exposed by the plurality of trenches 207, and an insulating layer 209 disposed in the groove 207. In some embodiments, there are a plurality of active regions 206, and each active region 206 is disposed between two adjacent trenches 207.

In some embodiments, the material of the first protective layer 205 includes silicon oxide.

Although the present disclosure has been disclosed above, the present disclosure is not limited thereto. Any changes and modifications may be made by those skilled in the art without departing from the spirit and scope of the present disclosure, and the scope of the present disclosure should be determined by the appended claims.

The invention claimed is:

1. A method for forming a semiconductor structure, comprising:
- providing a substrate;
- forming a mask layer on the substrate, wherein the mask layer exposes a part of a surface of the substrate;
- etching the substrate by a plasma etching process using the mask layer as a mask to form a plurality of trenches and an active region between the plurality of trenches; and
- forming an insulating layer in the plurality of trenches; wherein the plasma etching process comprises:
  - performing a first etching process, wherein a plurality of initial trenches are formed in the substrate, an initial active region is formed between the plurality of initial trenches, and a corner region is formed between a top and a side wall of the active region;
  - performing a second etching process after the first etching process, wherein a reaction gas is introduced into an etching cavity to form a first protective layer on a surface of the corner region exposed by the plurality of initial trenches, wherein the first protective layer is also formed at a bottom of the plurality of initial trenches; and
  - performing a third etching process after the second etching process, wherein the substrate at a bottom of the plurality of initial trenches is etched to form the active region and the plurality of trenches;
  - wherein in the third etching process, the first protective layer at the bottom of the plurality of initial trenches is etched, and the first protective layer on a side wall of the initial trench can protect the corner region in a subsequent etching process;
  - and wherein the method further comprises forming a second protective layer on the side wall and a bottom surface of the plurality of trenches after forming the plurality of trenches and before forming the insulating layer, wherein a thickness of the second protective layer is in a range of 50 Å to 150 Å.

2. The method according to claim 1, wherein forming the second protective layer comprises an in situ steam generation process.

3. The method according to claim 1, wherein in the first etching process, an etching gas comprises one or more of HBr, $CH_2F_2$ or $CF_4$, a gas flow is in a range of 15 sccm to 100 sccm, and an etching power is in a range of 350 W to 1500 W.

4. The method according to claim 1, wherein in the third etching process, an etching gas comprises one or more of HBr, $SF_6$, $CH_2F_2$ or $CH_3F$, and a gas flow ranges is in a range of 20 sccm to 400 sccm.

5. The method according to claim 1, wherein a depth of the plurality of initial trenches is in a range of 1100 Å to 1500 Å.

6. The method according to claim 1, wherein the mask layer comprises a first mask layer and a second mask layer disposed on the first mask layer.

7. The method according to claim 6, wherein the first mask layer is made by a material comprising silicon oxide, and the second mask layer is made by a material comprising silicon nitride.

8. The method according to claim 1, wherein the first protective layer is made by a material comprising silicon oxide.

9. The method according to claim 8, wherein in the second etching process, the reaction gas comprises oxygen having a flow rate greater than or equal to 100 sccm, and a radio frequency power is greater than or equal to 900 W.

10. The method according to claim 9, wherein in the second etching process, the flow rate of oxygen is in a range of 100 sccm to 240 sccm, and the radio frequency power is in a range of 900 W to 1300 W.

11. The method according to claim 1, wherein the insulating layer is also disposed between adjacent mask layers.

12. The method according to claim 11, wherein forming the insulating layer comprises:

forming an insulating material layer in the plurality of trenches and on a surface of the mask layer; and planarizing the insulating material layer until the surface of the mask layer is exposed.

13. The method according to claim 12, wherein forming the insulating material layer comprises a high-density plasma deposition process.

14. The method according to claim 12, further comprising:

removing the mask layer and exposing a top surface of the active region after forming the insulating layer; and forming a gate oxide layer on a surface of the active region and forming a gate electrode on a surface of the gate oxide layer.

* * * * *